(12) United States Patent
Jakob et al.

(10) Patent No.: US 7,221,066 B2
(45) Date of Patent: May 22, 2007

(54) ENERGY SUPPLY UNIT FOR TRANSMITTING AUXILIARY ENERGY TO AN ELECTRICAL DEVICE

(75) Inventors: Roland Jakob, Berlin (DE); David Rudniski, Toronto (CA); Guenter Junge, Berlin (DE)

(73) Assignee: Alstom, Paris (FR)

( * ) Notice: Subject to any disclaimer, the term of this patent is extended or adjusted under 35 U.S.C. 154(b) by 562 days.

(21) Appl. No.: 10/344,766

(22) PCT Filed: Jun. 2, 2001

(86) PCT No.: PCT/EP01/06325

§ 371 (c)(1),
(2), (4) Date: Jul. 21, 2003

(87) PCT Pub. No.: WO02/15375

PCT Pub. Date: Feb. 21, 2002

(65) Prior Publication Data

US 2004/0084973 A1      May 6, 2004

(30) Foreign Application Priority Data

Aug. 14, 2000   (DE)   ................. 100 39 707

(51) Int. Cl.
*H01F 27/42*   (2006.01)
*H01F 37/00*   (2006.01)
*H01F 38/00*   (2006.01)

(52) U.S. Cl. ...................................... 307/104
(58) Field of Classification Search ................. 307/104
See application file for complete search history.

(56) References Cited

U.S. PATENT DOCUMENTS

| 3,409,805 A | 11/1968 | Whipple et al. |
| 4,622,627 A | 11/1986 | Rodriguez et al. |
| 4,713,723 A | 12/1987 | Kaufman |

(Continued)

FOREIGN PATENT DOCUMENTS

DE    19948454    5/2001

(Continued)

OTHER PUBLICATIONS

Patent Abstracts of Japan; Dec. 5, 1991 vol. 15/No. 479.

(Continued)

*Primary Examiner*—Stephen W. Jackson
*Assistant Examiner*—Carlos Amaya
(74) *Attorney, Agent, or Firm*—Harness, Dickey & Pierce, P.L.C.

(57) ABSTRACT

An energy supply unit includes a primary coil which is at least indirectly connected to an energy source. In a secondary coil which is at least indirectly connected to the control circuit, and an insulating section formed between the primary coil and the secondary coil. The auxiliary energy is transmitted via the insulating section by way of a magnetic alternating field. The energy supply unit further includes a first carrier plate, a primary coil embodied as a flat coil situated on the first carrier plate, a second carrier plate, and a secondary coil embodied as a flat coil situated on the second carrier plate. The insulating section is embodied as an interferric space formed between the primary coil and the secondary coil.

22 Claims, 2 Drawing Sheets

U.S. PATENT DOCUMENTS

| | | | | |
|---|---|---|---|---|
| 5,654,621 A | * | 8/1997 | Seelig | 320/108 |
| 5,684,445 A | * | 11/1997 | Kobayashi et al. | 336/83 |
| 5,929,598 A | * | 7/1999 | Nakama et al. | 320/108 |
| 5,949,155 A | | 9/1999 | Tamura et al. | |

FOREIGN PATENT DOCUMENTS

| | | |
|---|---|---|
| DE | 19802473 | 4/2002 |
| EP | 0817351 A2 | 7/1997 |
| JP | 11018323 | 1/1999 |

OTHER PUBLICATIONS

Patent Abstracts of Japan; Aug. 12, 1994 vol. 18/No. 434.

Patent Abstract of Japan; Jun. 22, 1999; "Non-Contact Feeding Device"; © 1999, JPO.

Janson et al.; "AC-DC Converter With Parametric Reactive Power Compensation"; *IEEE* vol. 46, No. 3; Jun. 1999; pp. 554-562.

Tang et al.; "Characterization of Coreless Printed Circuit Board (PCB) Transformers" © 1999 *IEEE*; pp. 746-752.

* cited by examiner

ENERGY SUPPLY UNIT FOR TRANSMITTING AUXILIARY ENERGY TO AN ELECTRICAL DEVICE

This application is the national phase under 35 U.S.C. §371 of PCT International Application No. PCT/EP01/06325 which has an International filing date of Jun. 2, 2001, which designated the United States of America and which claims priority on German Patent Application number DE 100 39 707.7 filed Aug. 14, 2000, the entire contents of which are hereby incorporated herein by reference.

FIELD OF THE INVENTION

The present invention generally relates to an energy supply unit for transmitting auxiliary energy to an electrical device, especially for a control circuit in a medium or high tension facility. The energy supply unit may have a primary coil that stands at least indirectly in connection with an energy source, a secondary coil, that may stand at least indirectly in connection with the control circuit, and an insulating section that may be constructed between the primary coil and the secondary coil through which the transmission of the auxiliary energy takes place using a magnetic alternating field.

BACKGROUND OF THE INVENTION

Power converters installed in multilevel switching for use in middle and high tension facilities are known from the state of the art (cf. U.S. Pat. No. 5,737,201 and EP 0 944 163 A1). A multilevel switching permits a modular construction of a power converter. Each of the modules includes at least two semiconductor power switches and at least one capacitor arranged between the power switches. The particular character of multilevel switching is that the capacitors do not all lie at the same potential, but can be related to different potentials (so-called "floating capacitors"). An intermediate circuit voltage is in this way passed on to several "floating capacitors" such that the voltage stress of the semiconductor power switch appears as the difference between the voltages of two capacitors.

With power converters installed in multilevel switching, the energy supply unit (as with power converters with semiconductor power switches connected in series) may furnish the auxiliary energy for a control circuit for activation of various power switches at different high potentials. Even with other auxiliary facilities, such as, for example, measuring circuits, an energy supply at high potential must be guaranteed.

Various energy supply units for energy supply of power converters are known from the state of the art. Thus, for example, a single voltage provision is known in which the energy transmission and a potential separation for the individual semiconductor power switches take place by conventional prefabricated impulse transmitters, whereby the windings of the transmitter are insulated from one another using a casting compound. But it is technically very expensive to manufacture such energy supply units for such high insulation voltages as they occur with control switches for medium and high voltage facilities. These known energy supply units are correspondingly expensive.

Moreover, energy supply units with a common voltage supply through a medium frequency (MF) ring feeder are known. The MF ring feeder is fed from a centrally arranged MF converter with medium frequency alternating current in the range of some 10 kHz. The MF ring feeder includes an insulated high voltage (HV) cable that runs in the power converter which leads to a relatively high leakage inductance. Energy tapping at semiconductor power switch drivers located at various electric potentials is undertaken with the aid of ferrite cores that envelop the HV cable. The potential separation, moreover, must either completely take possession of the insulation of the HV cable upon which correspondingly high standards or glow dielectric strength are then to be imposed, or the air space between cable jacket and ferrite core must be sufficiently amply dimensioned to avoid flashovers to the core material reliably.

SUMMARY OF THE INVENTION

The present invention generally provides an energy supply unit that generates a low leakage inductance and a large coupling inductance and has a simple and economical construction.

An embodiment of the present invention includes and energy supply unit having a first supporting plate, a primary coil constructed on the first supporting plate as a flat coil, a second supporting plate, and a secondary coil constructed on the second supporting plate as a flat coil, wherein the insulation section is constructed as an air gap fashioned between the primary coil and the secondary coil.

Air may be used as an insulation medium with the energy supply unit of the invention. In this way, an aging of the insulation by partial discharges in the insulation material is not possible. The energy supply unit thus has an extremely high partial discharge strength. A partial discharge test as a component test within the framework of manufacturing the energy supply unit is not necessary. Moreover, the insulation section can be visibly configured so that covert defects are hardly possible. Finally, the energy supply unit of the invention has a simple construction and can be scaled in an especially simple manner for different insulation and output requirements.

The supporting plates may be made of any desired insulation material, preferably of plastic. The primary coil and the secondary coil can be mounted on the supporting plates in any desired manner. It is especially intended that the flat coils will be applied onto the supporting plates according to a lithographic or thin layer procedure inherently known on the basis of microelectronics. The length of the air section between the coils is designed such that a specifiable insulation voltage is reached.

The energy supply unit of the invention is in particular suited for use in power converters (in inverters or in rectifiers) of middle or high voltage facilities in which the auxiliary energy must be furnished for a control circuit for activation of semiconductor power switches at different high potentials. The energy supply unit of the invention can nonetheless also be installed in any other desired electrical arrangement, especially where an energy supply at high potential is required, such as, for example, in measuring circuits.

In supplying a control circuit for semiconductor power switches in a power converter of a middle and high voltage facility with auxiliary energy, it can be advantageous to arrange the energy supply unit between a power switch and a component (cabinet wall, chassis, etc.) of the power converter lying at ground potential, such that the primary side of the energy supply unit is situated near the ground element and the secondary side is situated near the power switch. Fastening the primary side to the component lying at ground potential and the secondary side to the semiconductor power switch is conceivable.

Of course, several secondary coils can also be arranged on the secondary side of the energy supply unit of the invention-as is also the case with conventional transmitters known on the basis of the state of the art-so that several voltages can be generated with low additional expense.

In accordance with an advantageous further development of the present invention, it is proposed that the auxiliary energy be developed as a direct voltage, whereby an oscillator circuit is arranged between the energy source and the primary coil that generates an alternating voltage from an input direct voltage of the energy source for feeding the primary coil, and a circuit for rectification of the output voltage is arranged between the secondary coil and the control circuit. In accordance with this further development, a direct voltage transmitter is proposed which is realized in the form of two supporting plates. The direct voltage transmitter transmits the energy in the form of a magnetic alternating field through the air gap of the primary coil incorporated on the primary side supporting plate. The input direct voltage can be relatively easily rendered free of interference against high frequency (HF) interference through conventional interference suppression measures or low operating volumes of the coils.

Advantageously the output voltage stabilizes and/or smoothes the circuit for rectification. Ideally the alternating voltage has an at least approximately sinusoid course. The oscillator circuit advantageously has a capacitor for compensation of reactive power. In this way, if need be necessary reactive power can be compensated through the capacitor directly in the oscillator circuit, so that a direct current with a low upper wave component can be drawn from the direct voltage supply.

The supporting plates may be arranged advantageously to each other so that the middle point of the primary coil is arranged in relation toward the middle point of the secondary coil. It is, for example, conceivable that the two supporting plates are arranged pivoted 180° about an imaginary connection line through the two middle points relative to each other on the basis of an exactly opposed mirror image position. The oscillator circuit on the first supporting plate and the circuit for rectification on the second supporting plate are then arranged at an especially great distance to each other. These measures can decisively contribute to the interference suppression for the energy supply unit of the invention.

In accordance with another advantageous refinement of the present invention, it is proposed that the primary coil and the secondary coil be set up spiral-like on the supporting plates. Coils constructed in this manner have an especially low unit height and can be manufactured particularly economically. Moreover, especially on the secondary side, several coils engaging into one another can be installed on the supporting plate without difficulty.

In accordance with an embodiment of the present invention, it is proposed that at least one insulating plate be arranged in the air gap between the supporting plates. With this embodiment, air serves as the medium of insulation now as before. At least one insulating plate occupies only a small space between the supporting plates and consequently absorbs but a small part of the voltage between the supporting plates. Thus only small demands with respect to partial discharge strength are imposed upon the insulating plate. Without the insulating plate, the length of the air section between the two coils corresponds to the width of the air gap. The air section between the coils through the insulating plate arranged between the support plates can be significantly lengthened while the distance remains constant. At least one insulating plate consists of any desired insulation material, for example plastic.

Advantageously, an insulating plate is arranged in the air gap between the supporting plates which has a greater surface than the supporting plates, whereby the edges of the insulating plates protrude laterally over the edges of the supporting plates. In this way, the air section between the coils can once again be lengthened. The length of the air section can almost be varied at will through selection of the dimensions of the insulating plate.

In accordance with a further embodiment of the present invention, it is proposed that the supporting plates be arranged equidistant from each other at least in the area of the primary coil or the secondary coil.

Spacers are arranged advantageously between the supporting plates or between the supporting plates and at least one insulating plate. Through the spacers, the distance between the supporting plates and therewith between the coils can be held to a constant value. The supporting plates or at least one insulating plate are preferably fastened on the spacers. In this way, the stability of the energy supply unit of the invention can be significantly increased.

Preferably three spacers may be provided in each case between the supporting plates and between the supporting plates and at least one insulating plate. Through the three spacers, the position of the supporting plates of the position of the insulating plate relative to the supporting plate can be reliably, precisely and unambiguously established relative to one another.

In order to avoid that creep sections form through the spacers, it is proposed that the spacers arranged between the first supporting plate and at least one insulating plate and the spacers arranged between the second supporting plate and at least one insulating plate be fastened staggered in relation to each other on at least one insulating plate. With the energy supply unit of the invention, the air section and the creep sections can be exactly dimensioned and adapted to the given requirements.

Finally, it is proposed that an additional coil constructed on the first supporting plate as a flat coil be arranged in the region of the magnetic alternating field, which is connected to the control unit. The additional coil can be arranged in the region of the primary coil engaging, for example, into the primary coil. The control unit is, for example, constructed as an evaluating unit that evaluates a voltage induced during the orderly operation of the energy supply unit in the additional coil, or is constructed as a control light, especially as a luminescence diode (LED) that indicates the orderly contact of an alternating field during the operation of the energy supply unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
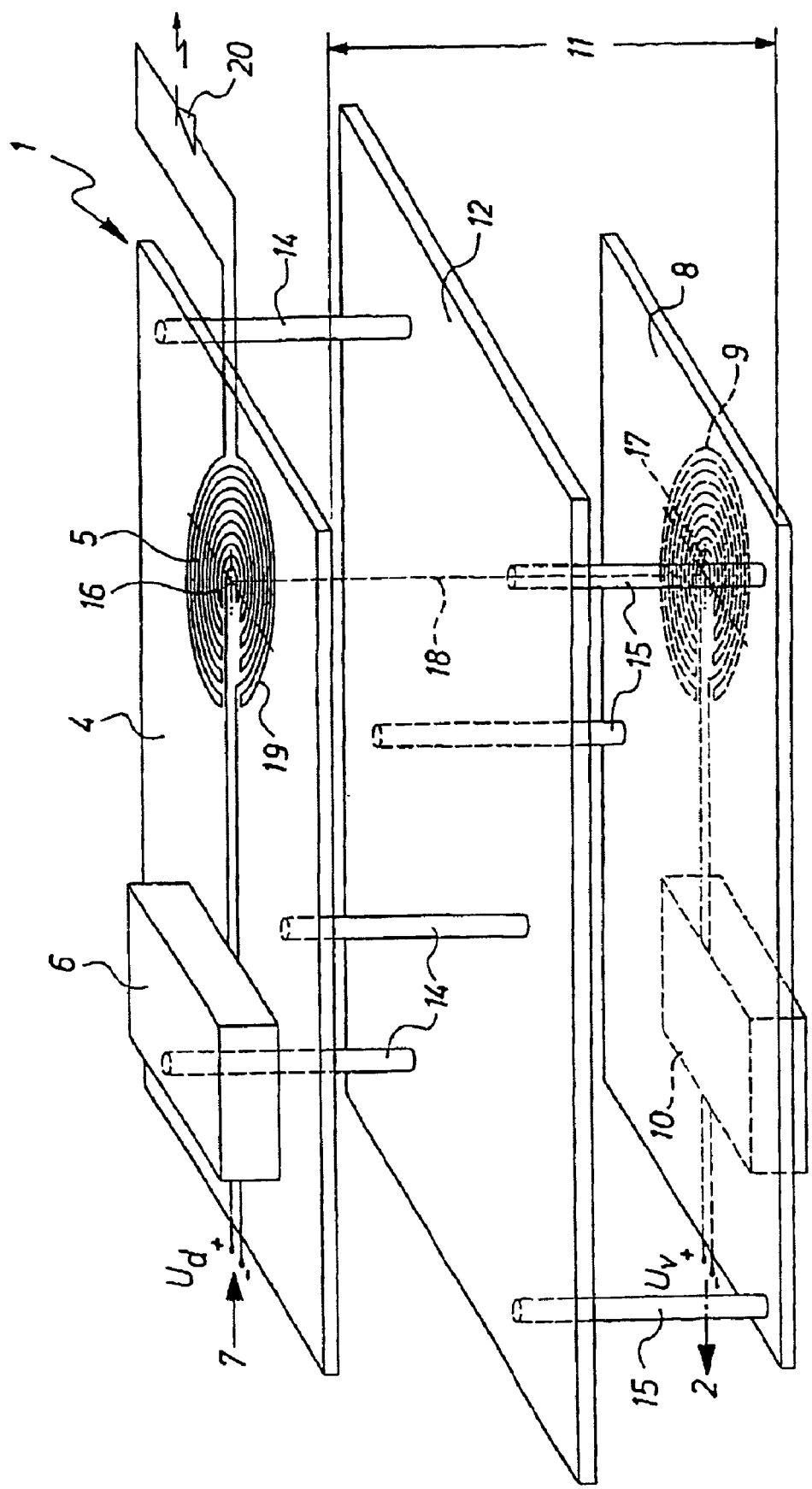
FIG. 1 illustrates an energy supply unit of the invention in accordance with a preferred embodiment in perspective representation.
Figure 2:
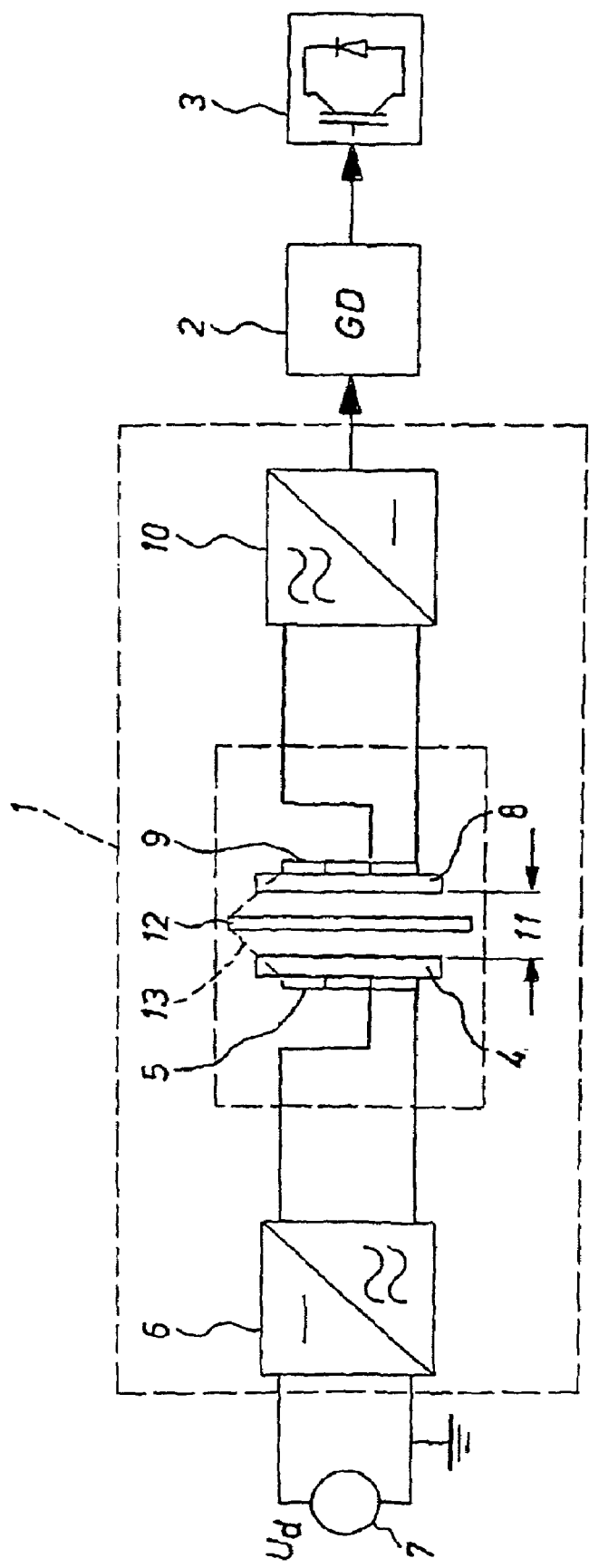
FIG. 2 illustrates a block diagram of the energy supply unit of the invention from FIG. 1.

An energy supply unit of the invention is designated in entirely with the reference number 1 in FIG. 1 and FIG. 2. The energy supply unit 1 serves to transmit auxiliary energy for a control switch 2 (so-called gate drive, GD; cf. FIG. 2) in a power converter of a medium or high tension facility. The control circuit 2 serves to activate semiconductor power switches 3 of the power converter. The power converter is preferably constructed in multilevel switching. The control circuit 2 furnishes the power switches 3 with different, high potentials. The power circuits 3 are, for example, constructed as IGBT's (Insulate Gate Bipolar Transistors).

The energy supply unit 1 has a first supporting plate 4 with a primary coil 5 installed thereupon as a flat coil. The primary coil 5 is connected with a direct voltage source U_d through an oscillator circuit 6. The oscillator circuit 6 generates an alternating voltage for feeding the primary coil 5 on the basis of an input direct voltage U_d of the energy source 7. The alternating voltage has an at least approximately sinusoid course. Moreover, the energy supply unit 1 has a second supporting plate 8 with a secondary coil 9 constructed thereupon as a flat coil. The secondary coil 9 stands in connection with the control circuit 2 through a circuit 10 for rectifying the output voltage U_v. The circuit 10 for rectifying the output voltage U_v moreover implements a stabilization and/or smoothing of the output voltage U_v. Of course, several secondary coils 9 can also be arranged on the secondary side 8, 9, 10 of the energy supply unit 1 of the invention-as is also the case with conventional transmitters known on the basis of the state of the art-so that several output voltages U_v can be generated with little additional expenditure.

An air gap 11 is formed between the primary coil 5 and the secondary coil 9. The air gap 11 corresponds to the distance between the two coils 5, 9 to each other. An insulating plate 12 is arranged in the air gap 11 through which an air section 13 between coils 5, 9 can be significantly lengthened while the width of the air gap 11 remains constant. The insulating plate 12 has a larger surface than the supporting plates 4, 8, whereby the edges of the insulating plate 12 laterally project over the edges of the supporting plates 4, 8. In this way, the air section 13 between coils 5, 9 can once again be lengthened. The air stretch 13 is designed such that a specifiable insulation voltage is reached. The insulating plate 12 is made of any desired insulation material, preferably of plastic. The auxiliary energy for the control circuit 2 is transmitted using a magnetic alternating field over air gap 11.

The supporting plates 4, 8 are made of any desired insulation material, preferably plastic. The coils 5, 9 are constructed spiral-like. The primary coil 5 and the secondary coil 9 are installed on the supporting plates 4, 8 in any desired manner, preferably according to a lithographic or thin layer procedure inherently known on the basis of microelectronics for manufacturing printed circuits.

The supporting plates 4, 8 are arranged equidistant from one another. A middle point 16 of the primary coil 5 is arranged opposite a middle point 17 of the secondary coil 9. It is, for example, conceivable that the two supporting plates 4, 8 are pivoted 180□ about an imaginary connection line 18 through the two central points 16, 17 relative to one another in the exactly opposed mirror image position represented in FIG. 1. The distance between the oscillator circuit 6 and the circuit 10 for rectification would then be especially great, which would lead to an interference suppression of the energy supply unit 1.

It is conceivable that the primary coil 4, 5, 6 of the energy supply unit 1 is fastened on a component (cabinet wall, chassis etc.) of the power converter lying a ground potential and that the secondary side 8, 9, 10 is fastened on the semiconductor power switch 2. Since the component lying at ground potential as well as the power switch 2 usually have an exactly defined position in the power converter, the primary side 4, 5, 6 and the secondary side 8, 9, 10 are therewith also exactly positioned, and the air gap 11 has an exactly defined width.

Alternatively or additionally, the air gap 11 can be securely and reliably fixed in the exactly defined breadth by spacers 14, 15. Three spacers 14 are arranged between the first supporting plate 4 and the insulating plate 12 and fastened on plates 4, 12. Three additional spacers 15 are arranged between the second supporting plate 8 and the insulating plate 12 and fastened on plates 8, 12. In order to avoid the formation of creep sections over the spacers 14, 15, the spacers 14 are fastened staggered in relation to spacers 15 on the insulating plate.

Finally an additional coil 19 is formed on the first supporting plate 4 as a flat coil in the region of the magnetic alternating field. The further coil 19 runs outside around the primary coil 5. The additional coil 19 is directly connected to a control unit constructed as a luminescence diode (LED) 20. The LED 20 indicates the contact of an orderly alternating field during operation of the energy supply unit 1.

What is claimed is:

1. An energy supply unit for transmitting auxiliary energy for a control circuit in a medium or high voltage facility, comprising:
    a primary coil being at least indirectly in connection with an energy source;
    a secondary coil being at least indirectly in connection with a control circuit; and
    an insulating section installed between the primary coil and the secondary coil, over which the transmission of auxiliary energy takes place by way of a magnetic alternating field,
    wherein the primary coil is constructed as a flat coil and installed on a first supporting plate, and the secondary coil is constructed as a flat coil and installed on a second supporting plate, the two supporting plates being arranged at a defined distance from each other, and the insulating section is constructed as an air gap formed between the primary coil and the secondary coil,
    wherein an insulating plate is arranged in the air gap between the supporting plates which has a larger surface than the supporting plates, whereby the edges of the insulating plate laterally project over the edges of the supporting plates.

2. The energy supply unit according to claim 1, wherein the auxiliary energy is formed as a direct voltage (U_v), an oscillator circuit is arranged between the energy source and the primary coil which generates an alternating voltage from an input direct voltage (U_d) of the energy source for feeding the primary coil, and a circuit for rectifying the output voltage (U_v) is arranged between the secondary coil and the control circuit.

3. The energy supply unit according to claim 2, wherein the circuit stabilizes or smoothes the output voltage (U_v).

4. The energy supply unit according to claim 3, wherein the alternating voltage has an at least approximately sinusoid course.

5. The energy supply unit according to claim 3, wherein the oscillator circuit has a capacitor for compensating for reactive power.

6. The energy supply unit according to claim 3, wherein the primary coil and the secondary coil are installed in a spiral manner on the supporting plates.

7. The energy supply unit according to claim 2, wherein the alternating voltage has an at least approximately sinusoid course.

8. The energy supply unit according to claim 7, wherein the oscillator circuit has a capacitor for compensating for reactive power.

9. The energy supply unit according to claim 7, wherein the primary coil and the secondary coil are installed in a spiral manner on the supporting plates.

10. The energy supply unit according to claim 2, wherein the oscillator circuit has a capacitor for compensating for reactive power.

11. The energy supply unit according to claim 10, wherein the primary coil and the secondary coil are installed in a spiral manner on the supporting plates.

12. The energy supply unit according to claim 2, wherein the primary coil and the secondary coil are installed in a spiral manner on the supporting plates.

13. The energy supply unit according to claim 1, wherein the primary coil and the secondary coil are installed in a spiral manner on the supporting plates.

14. The energy supply unit according to claim 13, wherein the supporting plates are arranged relative to each other such that a center point of the primary coil is arranged opposite a center point of the secondary coil.

15. The energy supply unit according to claim 1, wherein the supporting plates are uniformly spaced apart from one another in the region of the primary coil and the secondary coil.

16. The energy supply unit according to claim 1, wherein spacers are arranged between one of the supporting plates and between the supporting plates and the insulating plate.

17. The energy supply unit according to claim 16, wherein the supporting plates are fastened to the spacers.

18. The energy supply unit according to claim 17, wherein the spacers are provided between one of the supporting plates and the supporting plates and the insulating plate.

19. The energy supply unit according to claim 16, wherein the spacers are provided between one of the supporting plates and the supporting plates and the insulating plate.

20. The energy supply unit according to claim 19, wherein the spacers arranged between the first supporting plate and the insulating plate and the spacers arranged between the second supporting plate and the insulating plate are fastened staggered in relation to one another on the insulating plate.

21. The energy supply unit according to claim 1, wherein a further coil installed on the first supporting plate as a flat coil is arranged in a region of the magnetic alternating field which is connected to a control unit.

22. An energy supply unit for transmitting auxiliary energy for a control circuit in a medium or high voltage facility, comprising:
   a primary coil being at least indirectly in connection with an energy source;
   a secondary coil being at least indirectly in connection with a control circuit; and
   an insulating section installed between the primary coil and the secondary coil, over which the transmission of auxiliary energy takes place by way of a magnetic alternating field,
   wherein the primary coil is constructed as a flat coil and installed on a first supporting plate, and the secondary coil is constructed as a flat coil and installed on a second supporting plate, the two supporting plates being arranged at a defined distance from each other, and the insulating section is constructed as an air gap formed between the primary coil and the secondary coil,
   wherein at least one insulating plate is arranged in the air gap between the supporting plates, and
   wherein an insulating plate is arranged in the air gap between the supporting plates which has a larger surface than the supporting plates, whereby the edges of the insulating plate laterally project over the edges of the supporting plates.

* * * * *